(12) United States Patent
van Bezooijen

(10) Patent No.: US 9,851,384 B2
(45) Date of Patent: Dec. 26, 2017

(54) MULTI-BAND IMPEDANCE DETECTOR

(71) Applicant: QUALCOMM Technologies, Inc., San Diego, CA (US)

(72) Inventor: Adrianus van Bezooijen, Molenhoek (NL)

(73) Assignee: QUALCOMM Incorporated, San Diego, CA (US)

( * ) Notice: Subject to any disclaimer, the term of this patent is extended or adjusted under 35 U.S.C. 154(b) by 84 days.

(21) Appl. No.: 14/646,473

(22) PCT Filed: Nov. 22, 2012

(86) PCT No.: PCT/EP2012/073397
§ 371 (c)(1),
(2) Date: May 21, 2015

(87) PCT Pub. No.: WO2014/079502
PCT Pub. Date: May 30, 2014

(65) Prior Publication Data
US 2015/0293159 A1    Oct. 15, 2015

(51) Int. Cl.
*G01R 27/04* (2006.01)
*H03H 7/40* (2006.01)
*H04B 1/04* (2006.01)

(52) U.S. Cl.
CPC ............... *G01R 27/04* (2013.01); *H03H 7/40* (2013.01); *H04B 1/0458* (2013.01)

(58) Field of Classification Search
CPC ......... G01R 27/04; H03H 7/40; H04B 1/0458
See application file for complete search history.

(56) References Cited

U.S. PATENT DOCUMENTS

| 2008/0106350 | A1 | 5/2008 | McKinzie et al. | |
| 2010/0195547 | A1 | 8/2010 | Vice et al. | |
| 2010/0321086 | A1* | 12/2010 | See | H04B 1/0458 327/359 |
| 2012/0169566 | A1* | 7/2012 | Chan Wai Po | H03F 1/56 343/860 |

OTHER PUBLICATIONS

International Search Report and Written Opinion—PCT/EP20121073397—ISA/EPO—Aug. 7, 2013 (140942WO).

* cited by examiner

*Primary Examiner* — Patrick Assouad
*Assistant Examiner* — Haidong Zhang
(74) *Attorney, Agent, or Firm* — Smith Tempel Blaha LLC

(57) ABSTRACT

An impedance detector includes a sensing circuit with an adjustable impedance. The sensing circuit is coupled to a signal path. Further, an evaluation circuit is coupled to the sensing circuit.

20 Claims, 8 Drawing Sheets

MULTI-BAND IMPEDANCE DETECTOR

The invention refers to impedance detectors, e.g. for use in mobile communication devices, and to mobile communication devices comprising an impedance detector.

BACKGROUND

Modern communication devices can comprise an antenna connected to a signal path that is susceptible to detuning due to unexpected external influences. To retune the antenna and to improve transmission and/or reception, the mobile communication device can comprise an antenna tuner with an impedance matching network for adaptive impedance matching. However, the actual impedance of the signal path and/or of the antenna must be known.

Further, mobile communication devices operate with different transmission systems and in different frequency bands. Multi-transmission system devices and multi-frequency devices render the determination of the actual impedance of the signal path and/or of the antenna problematic.

Conventional impedance detectors are known, e.g. from U.S. Pat. No. 8,111,111.

What is needed is an impedance detector that works well with different transmission systems and different frequency bands, and that allows to determine the actual impedance and/or the mismatch of the actual impedance compared to a desired impedance.

SUMMARY OF THE INVENTION

Therefore, it is an object of the present invention to provide such an impedance detector and a mobile communication device comprising an impedance detector. It is a further object of the present invention to provide an impedance detector working precisely in a wide dynamic range, allowing low production costs, a high level of integration and small spatial dimensions. Further, it is an object of the present invention to provide an impedance detector that has especially improved resistance to interferers such as WLAN transmitters and up-link carrier aggregation, e.g. known from LTE systems.

An impedance detector and a mobile communication device comprising an impedance detector according to the independent claims are provided. Dependent claims provide preferred embodiments.

In order to obtain an impedance detector that fulfills specific requirements, single features described below or shown in the figures can be combined independently.

The impedance detector comprises a signal path with an input and an output. The impedance detector further comprises a sensing circuit coupled to the signal path. The impedance detector comprises further an evaluation circuit coupled to the sensing circuit for evaluating the interaction between an RF signal propagating in the signal path and the sensing circuit. The sensing circuit has an adjustable impedance $Z_{sense}$.

It was found that a sensing circuit having an adjustable impedance $Z_{sense}$ allows to establish an impedance detector that works well in different frequency bands and with different transmission systems. Conventional impedance detectors comprise an impedance element such as a capacitor or an inductor as a sensing element. Such impedance elements are referred to as "fixed impedance" elements. The impedance element is coupled to the signal path of a wireless RF device and may introduce an impedance transformation of the signal path. This transformation must be compensated, e.g. by a tunable matching network. However, the impedance of such a "fixed" impedance element does vary with frequency. As a result, different impedance transformations are obtained when conventional impedance detectors are used in a multi-frequency band or a multi-transmission system circuit.

The inventors found that the use of an adjustable impedance element yields a better impedance determination possibility as the impedance of the sensing circuit can be adjusted according to the specific time-dependent requirements. It is to be noted that the phrase "fixed impedance" and "adjustable impedance" refers to a specific frequency only.

In one embodiment, the impedance $Z_{sense}$ of the sensing circuit is adjusted according to the frequency of the RF signal propagating in the signal path. The impedance detector is a multi-band detector.

In contrast to an adaptively matched sensing impedance $Z_{sense}$, the conventional impedance detector has a fixed sensing impedance which results in an impedance transformation far from optimum at high frequencies when chosen for desired transformation at low frequencies and that results in a transformation far from optimum at low frequencies when chosen for a desired transformation at high frequencies. The present invention provides a solution where for a plurality of given frequencies, an optimum impedance transformation can be obtained.

The sensing circuit, thus, can comprise a tunable sensing element that reduces undesired impedance transformation and reduces the dynamic range requirements of the detector as a function of the frequency. Further, the immunity to interferers is improved.

In one embodiment, the sensing circuit comprises an adjustable impedance element and/or two parallel segments with at least one fixed impedance element in each segment.

The adjustable impedance element of the sensing circuit can be an impedance element the impedance of which can be adjusted continuously. Such an impedance element could be a varactor diode. However, it is possible that the sensing circuit comprises two or more parallel segments with at least one fixed impedance element in each segment and means to selectively couple a specific segment to the signal path. Then, the impedance detector provides mainly a plurality of impedance elements where different impedance elements work well with a special combination of a transmission system and a frequency band.

In one embodiment, the sensing circuit is electrically connected between the input and the output of the signal path.

Thus, it is possible that the respective at least one impedance element of the sensing circuit is directly connected to the signal path and allows a very precise determination of the actual impedance.

It is possible that at each point of time, exactly one or more than one impedance elements are directly connected to the signal path.

In one embodiment, the sensing circuit comprises two parallel segments with at least one fixed impedance element in each segment. The fixed impedance element in each segment is selected from a capacitance element and an inductance element. A capacitance element and an inductance element cause a drop in voltage and a change of the phase of the respective RF signal. The voltage drop and/or the phase difference can be utilized to determine the actual impedance. The impedance of a capacitance element decreases with increasing frequency and the impedance of an inductance element decreases with decreasing frequency. Depending on an actual frequency propagating in the signal path, the impedance element can be chosen to cause a reduced self-induced transformation of the signal path's impedance.

It is primarily possible to utilize the capacitance element for a low frequency band and an inductance element for a high frequency band, or vice-versa for obtaining a strong signal.

The sensing circuit can be utilized to determine the magnitude of the actual impedance and the phase of the actual impedance.

In one embodiment, the sensing circuit comprises a switch between the connection of an impedance element and the signal path.

The switch establishes a connection means for coupling the respective impedance element to the signal path. It is possible that the sensing circuit comprises two or a plurality of parallel segments and a first switch connecting a first connection of the respective parallel segment with the input of the signal path and a second switch connecting an output of the respective segment to the output of the signal path.

In one embodiment, the switch is selected from a semiconductor switch, a GaAs-pHEMT (GaAs: gallium arsenide, pHEMT=p high-electron mobility transistor) switch, an SOI (SOI=silicon on isolator) switch, an SOS (SOS=silicon on sapphire) switch, a MEMS switch (MEMS=micro-electromechanical system).

With switches based on the respective switching technology, arrays of switched capacitors can be obtained that establish a capacitance element with adjustable capacitance.

In one embodiment, the sensing circuit comprises a varactor.

An array of switch capacitors allows to adjust the capacitance in discrete steps while a varactor allows to adjust the capacitance continuously.

In one embodiment, the sensing circuit comprises an array of two or more capacitance or inductance elements. The sensing circuit may comprise parallel segments, where each parallel segment comprises one or more elements selected from a capacitance element and an inductance element.

Thus, for a specific frequency band and for a specific transmission system, an impedance can be adjusted using single-impedance elements or a network comprising a plurality of impedance elements.

In one embodiment, the sensing circuit comprises a frequency selective filter connected to a parallel connection of impedance elements.

The frequency-selective filter may be a diplexer or a duplexer. It is possible to use a first frequency-selective branching circuit and a second frequency-selective branching circuit and two or more parallel segments comprising impedance elements between the branching circuits. Then, instead of active, power consuming switches, passive filter circuits can be utilized to couple the specific impedance element to the signal path.

When switches are used to adjust the impedance of the sensing element, a control circuit may be used to activate the switches. An embodiment utilizing frequency-selective filters eliminates the necessity for a control circuit.

Conventional sensing elements utilize capacitance elements with fixed capacitance or inductance elements with fixed inductors. Especially inductors having a fixed inductance are problematic because large inductances or inductances having a high quality factor need to be realized as SMD elements restricting the degree of integration, increasing production costs and increasing special dimensions of the respective component. However, when switched impedance elements are utilized, the respective impedance elements, such as inductance elements or capacitance elements, can be realized as integrated impedance elements which need to have a certain quality factor only in a small frequency band as different elements can be utilized for different frequency bands. MIM (Metal-Insulator-Metal) capacitors can easily be integrated on-chip using interconnect layers thanks to their small size and low loss.

In one embodiment the impedance detector comprises an evaluation filter coupled between the sensing circuit and the evaluation circuit.

The evaluation filter can help discriminating a wanted signal from an interfering signal or an aggregated carrier. The evaluation filter can enhance the selectivity between wanted signals indicating the true response signal of the sensing circuit as a response to the signal propagating in the signal path and spurious signals. The evaluation circuit can comprise a low pass filter, a high pass filter, a notch filter and a band pass filter.

In one embodiment the impedance detector comprises a switching circuit between the sensing circuit and the evaluation circuit.

Via the switching circuit a specific evaluation filter can be selected from a plurality of different evaluation filters. Then, switchable filters are obtained that provide selectivity prior to operations of the evaluation circuit which may be non linear operations, e.g. if the evaluation circuit comprises RSSI (Receiving Signal Strength Indicator) chains, limiter amplifiers, mixers, etc.

In one embodiment the impedance detector comprises an attenuation circuit between the sensing circuit and the evaluation circuit.

In one embodiment the impedance detector comprises an amplification circuit between the sensing circuit and the evaluation circuit.

The attenuation circuit and/or the amplification circuit can help providing a preferred signal level to the evaluation circuit.

In one embodiment, the impedance detector comprises an adjustable impedance network. The impedance detector and the adjustable impedance network are part of an impedance matching circuit.

The adjustable impedance network may comprise circuit elements to allow to set the impedance of the adjustable impedance network to a specific desired value that may depend on the frequency and on the transmission system and on the actual impedance of the RF signal path. The adjustable impedance network thus allows to set the impedance of the signal path and allows to match the impedance despite external environmental influences.

In one embodiment, at least one of the impedance elements of the sensing circuit is an element of the adjustable impedance network.

The inventors found that an adjustable impedance network provides intrinsically an adjustable impedance element that may be utilized in the sensing circuit. Thus, at least a part of the adjustable impedance network can be utilized as the sensing circuit.

In one embodiment, the impedance detector comprises a substrate where the detector's circuit elements are arranged on or in the substrate.

As already described above, a higher degree of integration can be obtained with the present invention. Thus, it is possible to integrate all circuit elements of the detector in a single substrate.

In one embodiment, the substrate comprises Si (silicon). However, other semi-conductor substrates or insulating substrates, e.g. glass or sapphire, are also possible. Further, it is possible to integrate circuit elements in a dielectric multi-layer substrate with metallization plains between dielectric layers comprising a ceramic material.

In one embodiment, the impedance detector comprises an adjustable impedance network and a controller. The sensing circuit and/or the evaluation circuit and/or the adjustable impedance network and/or the controller is realized using a technology selected from: a Si-technology, a GaAs-technology, a CMOS (complementary metal oxide semi-conductor) technology, an SOS-technology, an SOI-technology.

Further, a mobile communication device is provided that comprises an impedance detector, e.g. according to an embodiment described above. The impedance detector is provided to determine the impedance of a signal path of the mobile communication device. The impedance detector may be connected to an adjustable impedance network and a closed loop control of the impedance of the signal path may be performed reducing an impedance mismatch to improve reception and transmission characteristics of the mobile communication device.

The mobile communication device can be a communication device that can work with LTE systems comprising more than one antenna.

Examples and features of the impedance detector and of the mobile communication device are shown in the schematic figures.

BRIEF DESCRIPTION OF THE FIGURES

FIG. 1 schematically shows the basic concept of the present impedance detector DET. The impedance detector DET comprises a signal path SP between a signal path input SPI and a signal path output SPO. In the signal path, an RF signal can propagate. A sensing circuit SC is coupled to the signal path SP. The sensing circuit SC has an adjustable impedance $Z_{sense}$. The impedance detector DET further comprises an evaluation circuit coupled to the sensing circuit. The evaluation circuit can be utilized to determine the actual impedance of the signal path SP via the sensing circuit SC, e.g. via a voltage drop over the sensing circuit SC or via a change in phase caused by the sensing circuit SC.

The sensing circuit SC allows to adjust the impedance $Z_{sense}$ to a specific value to improve the measurement of the actual impedance necessary for a multi-band impedance detector or for a multi-transmission system impedance detector.

Figure 1:
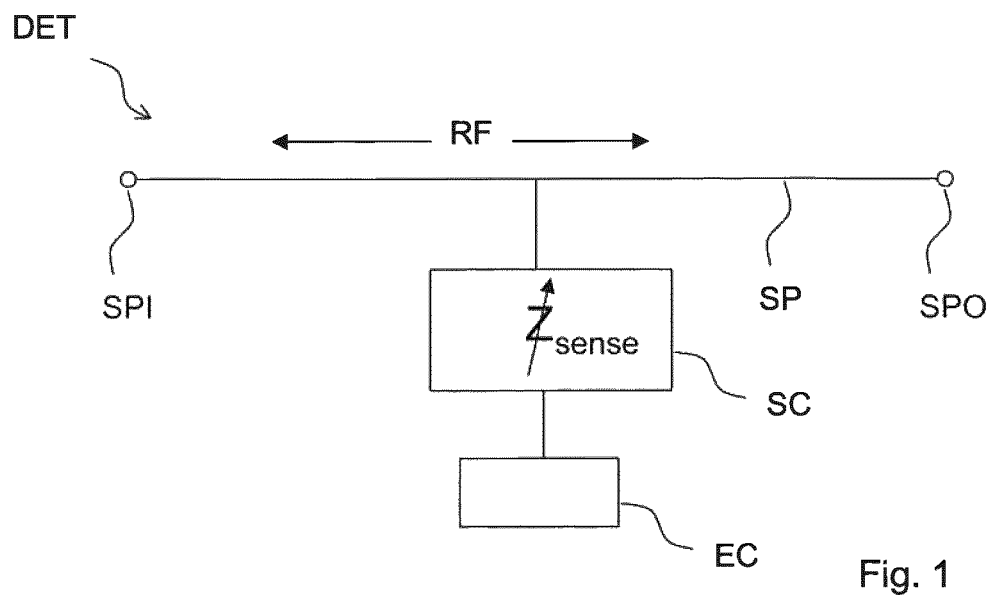
FIG. 1 schematically shows the basic concept of the present impedance detector.
Figure 2:
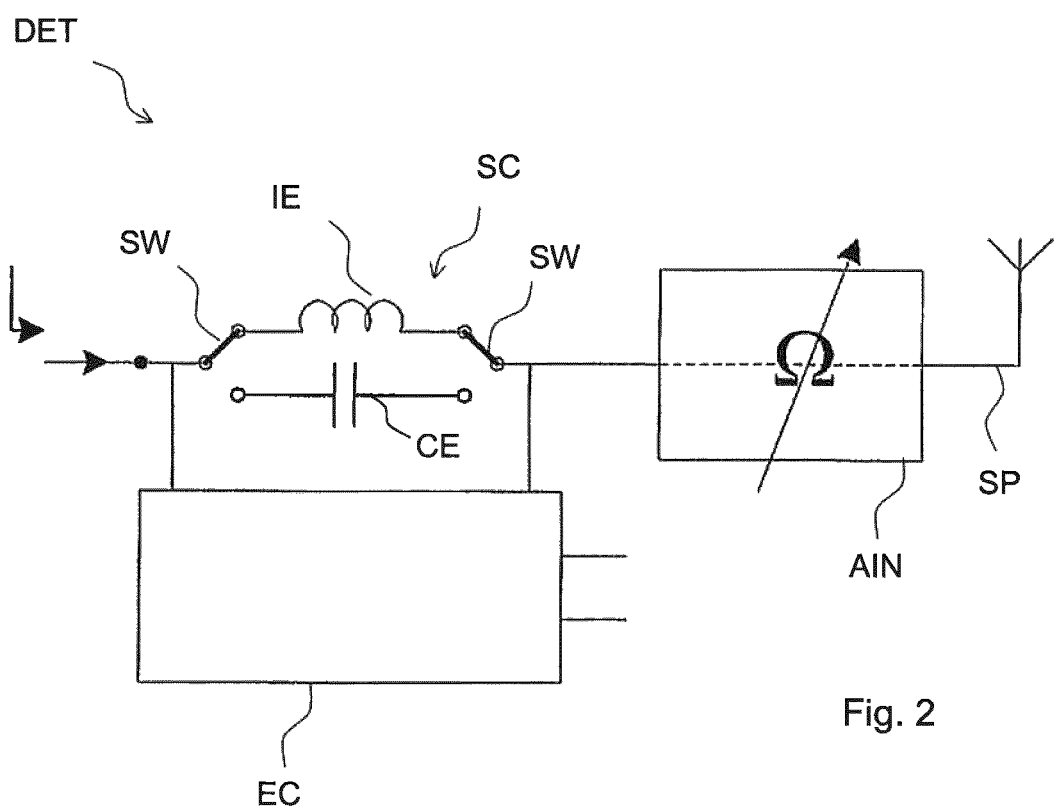
FIG. 2 schematically shows an embodiment of the impedance detector comprising a sensing circuit, an evaluation circuit and an adjustable impedance network, FIG. 3 schematically shows an embodiment of a sensing circuit comprising capacitances, FIG. 4 schematically shows an embodiment of the sensing circuit comprising inductance elements, FIG. 5 schematically shows an embodiment of the sensing circuit comprising an inductance element and a capacitance element, FIG. 6 schematically shows an embodiment of the switching circuit comprising a varactor, FIG. 7 schematically shows an embodiment of an impedance detector comprising an adjustable capacitance element as the switching/sensing circuit, FIG. 8 schematically shows an embodiment of the impedance detector with the evaluation circuit, FIG. 9 schematically shows an embodiment of the impedance detector further comprising an analog/digital converter and a control circuit, FIG. 10A schematically shows an embodiment of the impedance detector comprising frequency-selective filters, FIG. 10B schematically shows an embodiment of the impedance detector comprising an attenuation circuit, an amplification circuit, a switching circuit and an evaluation filter, FIG. 10C schematically illustrates a bipolar differential amplifier, FIG. 10D schematically illustrates a bipolar differential amplifier.

FIG. 2 schematically shows an embodiment of the impedance detector DET where the switching circuit SC comprises an inductance element IE and a capacitance element CE. The inductance element IE and the capacitance element CE are connected in respective parallel segments of the sensing circuit SC. Further, the sensing circuit SC comprises switches SW which can be utilized to directly connect the respective segment or to disconnect the segment from the signal path. Depending on the transmission system and on the frequency band, the respective impedance element contained in the sensing circuit SC can be chosen and coupled to the signal path to obtain an improved impedance measurement. The evaluation circuit EC is connected to the sensing circuit SC and provides a measure for the actual impedance or a measure for the voltage drop and/or the phase difference caused by the switching circuit SC at the output of the evaluation circuit EC.

Figure 3:
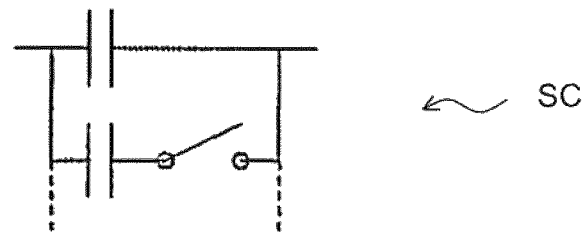

FIG. 3 schematically shows an embodiment of the switching circuit SC comprising different parallel segments with a capacitance element in each segment. Via a switch in each segment, the respective capacitance element can be coupled to the signal path or can be separated from the signal path. Especially if the capacitance values of the capacitance elements are chosen to be the $2^n$ times value of a basic capacitance $C_0$, then equidistant capacitance values can be obtained. However, the capacitance values of the capacitance elements can also be chosen to obtain a mainly homogenous density of capacitance states in the Smith chart.

Figure 4:
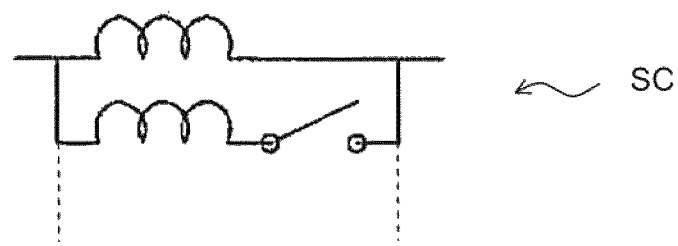

FIG. 4 shows an embodiment of the switching circuit SC comprising inductance elements in parallel segments of the sensing circuit SC corresponding to the switching topology of FIG. 3.

Figure 5:
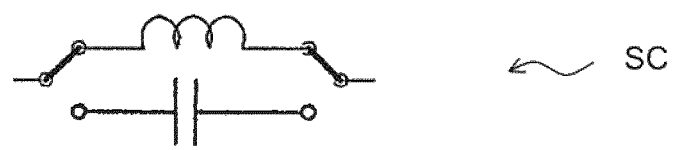

FIG. 5 schematically shows an embodiment of a sensing circuit SC comprising both: an inductance element and a capacitance element in parallel segments of the sensing circuit. The number of inductance and/or capacitance elements is not restricted to one. Further, more than one impedance element can be contained in each parallel segment.

Figure 6:
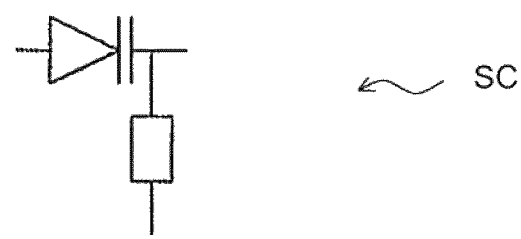

FIG. 6 shows an embodiment of the switching circuit SC where a varactor diode is utilized as an impedance element with a variable impedance. Depending on a bias voltage which may be applied via a resistive element connected to the varactor diode, the capacitance of the diode can be continuously adjusted.

Figure 7:
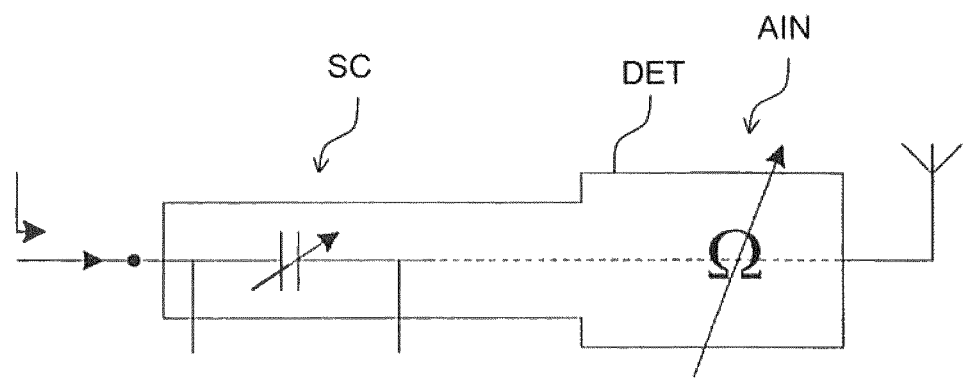

FIG. 7 shows an embodiment of the impedance detector DET, further comprising an adjustable impedance network AIN, the impedance of which can be adjusted in order to reduce an impedance mismatch in the signal path.

Figure 8:
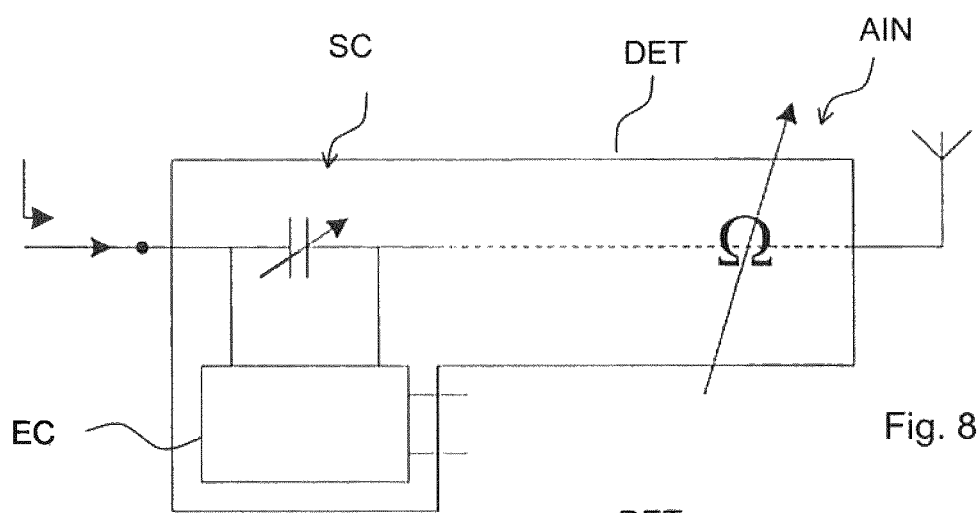

FIG. 8 shows an embodiment of the impedance detector DET where the evaluation circuit EC provides a measure for the actual impedance mismatch which can be utilized to set the impedance of the adjustable impedance network AIN to obtain impedance matching.

Figure 9:
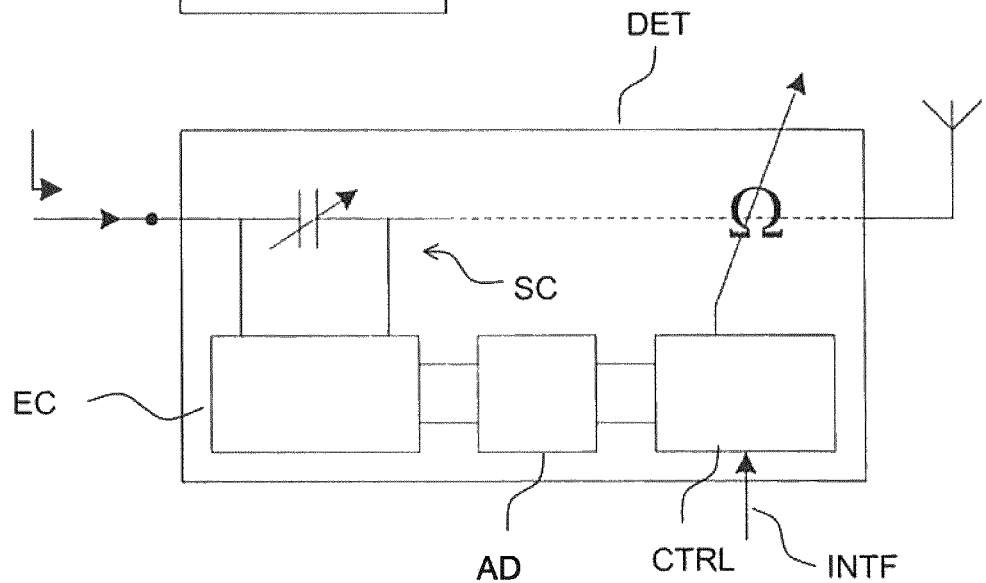

FIG. 9 schematically shows an embodiment of the impedance detector DET where an analog/digital converter AD is connected to the evaluation circuit EC to transform the measure for the actual impedance into the digital domain. The digitalized value is provided to a control circuit CTRL which determines the best impedance of the adjustable impedance network AIN. The control circuit CTRL comprises a signal interface INTF via which the control circuit CTRL can be connected to an external circuit, e.g. of a mobile communication device. Via the interface INTF, further information such as frequency information and/or transmission system information can be provided to the control circuit CTRL.

Figure 10A:
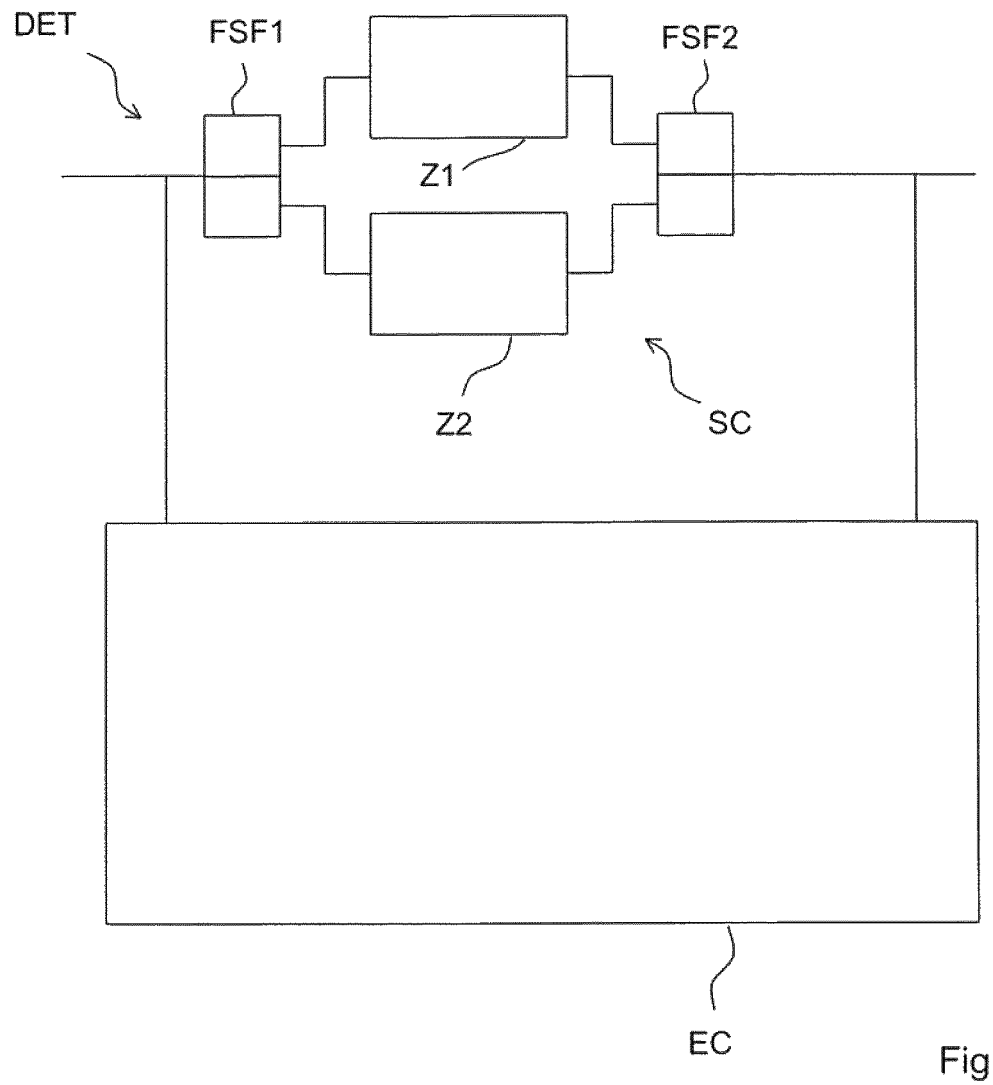
FIG. 10E shows the effect of an evaluation filter coupled before the evaluation circuit, FIG. 11 schematically illustrates the basic concept of impedance matching, FIG. 12 schematically shows the reactance of a sensing circuit in two different frequency bands, FIG. 13 schematically shows the frequency dependence of the sensing circuit's impedance in two different frequency bands.

FIG. 10A shows an embodiment of the impedance detector DET where frequency separating filters FSF1, FSF2 are utilized to frequency-selective connect or disconnect an impedance Z1, Z2 to or from the signal path SP. Thus, the sensing circuit SC comprises two or more impedance elements comprising different impedances and respective first and second frequency separating filters to perform coupling or decoupling. Then, no external control signals, as would be necessary for switches, are needed. Accordingly, the power consumption is reduced. The frequency separating filters FSF1, FSF2 could be diplexers or duplexers.

Figure 10B:
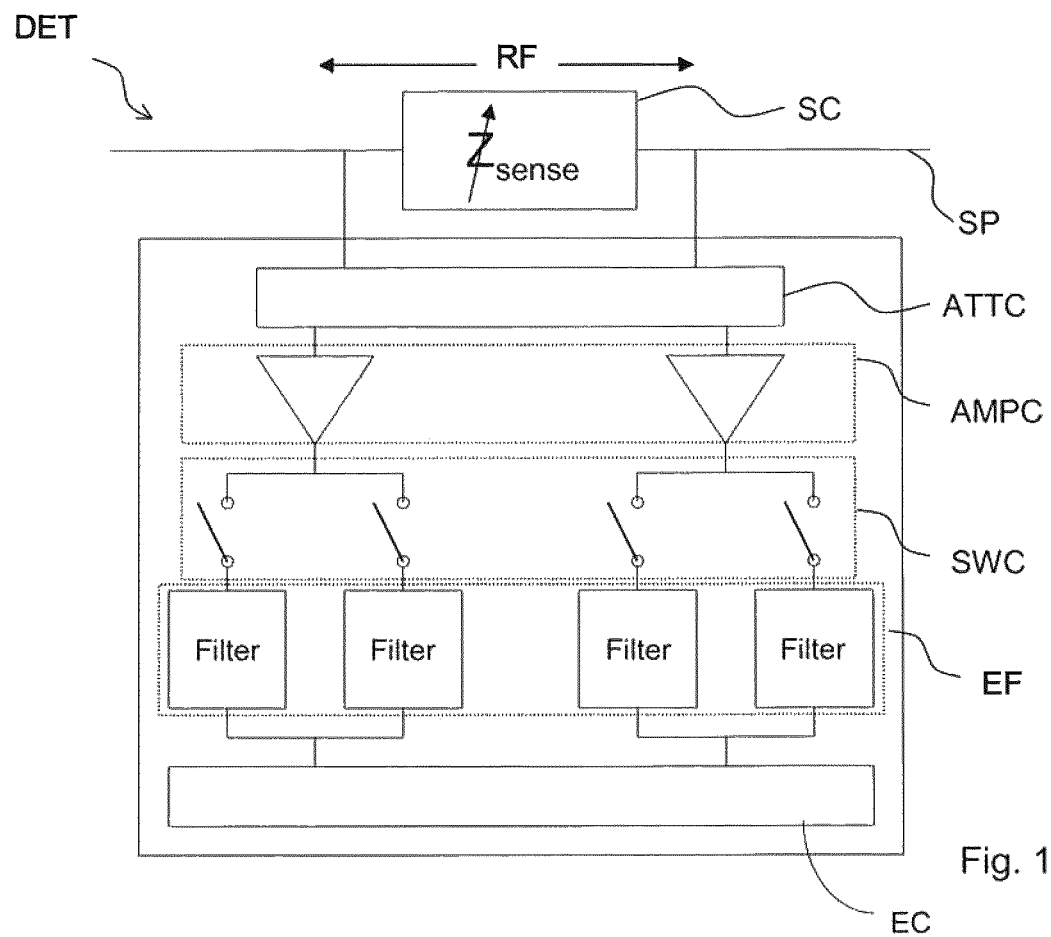

FIG. 10B shows an embodiment of the impedance detector DET where an attenuation circuit ATTC is connected between the signal path SP and an amplification circuit AMPC. Further, a switching circuit SWC is connected between the amplification circuit AMPC and an evaluation filter EF. The attenuation circuit ATTC and the amplification circuit AMPC can help obtain a signal level suited for linear or non-linear circuit elements of the evaluation circuit. Via the switching circuit SC different filters of the evaluation filter EF can be chosen to enhance the frequency selectivity of signals provided to the evaluation circuit.

Figure 10C:
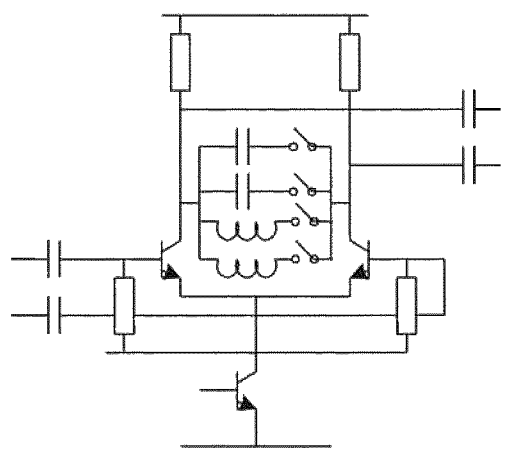

FIG. 10C shows a bipolar differential amplifier as a possible implementation of an amplifier circuit AMPC with a switched LC-network that acts as a tunable frequency selective load impedance as a possible implementation of parts of the switching circuit SWC and evaluation filter EF. The LC network can be configured as a tunable parallel LC band-pass filter representing a high impedance, and thus a high voltage gain, at the wanted frequency tuned either to the low-band or to high-band and representing a low impedance, and thus a low voltage gain, at the frequency of an aggregated carrier. The amplifier can comprise two capacitors in parallel paths and two inductance elements in further parallel paths connected parallel to the capacitance elements. Via switches the respective capacitance or inductance element can be coupled to or from the signal path.

Figure 10D:
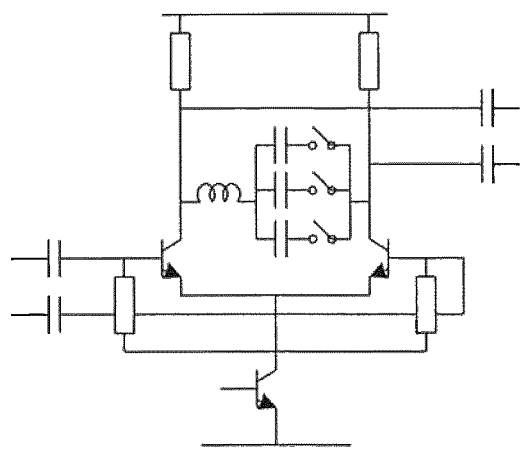

FIG. 10D also shows a bipolar differential amplifier as a possible implementation of an amplifier circuit AMPC with a switched LC-network that acts as a tunable frequency selective load impedance as a possible implementations of parts of the switching circuit SWC and evaluation filter EF. The LC-network is configured as a tunable Notch Filter, e.g. a band reject filter formed by the series-LC elements, representing a low impedance at the frequency of an aggregated carrier tuned either to the low-band or high-band and a high impedance at the wanted frequency in the other band. The amplifier can comprise two parallel paths. In each path a capacitance element can be coupled to or from the signal path via a switch. An inductance element is connected in series to the parallel connection of the capacitance elements.

Figure 10E:
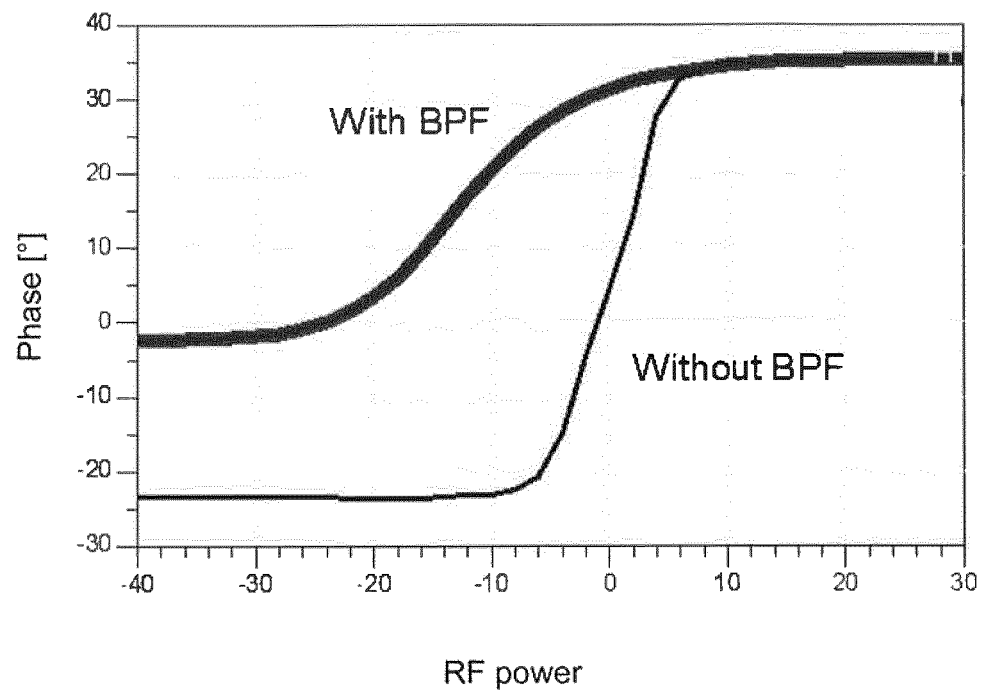

FIG. 10E shows the effect of the evaluation filter EF. The upper curve shows the power-dependent phase of an RF signal having a broad transition from −20 to +10 dBm. In contrast, the lower curve shows a change in phase mainly between −6 and +8 dBm. The upper curve illustrates the situation where a band-pass filter is present between the sensing circuit and the evaluation circuit. The lower curve shows the situation where no band-pass filter is present between the sensing circuit and the evaluation circuit. The main advantage of the band-pass filter is a frequency selectivity in detection of quantities such as impedance, phase of impedance, magnitude of an impedance, power.

A wide-band detector will respond to the "sum" of all incoming frequency components. The reading will be most representative for the strongest component. In case of impedance detection the reading of the detector is most representative for the impedance at the strongest component.

If the strongest frequency component is that of the wanted, we will get a reading of the wanted impedance, but if an interferer or aggregated carrier is strongest, we will get a reading of the impedance at the interfering frequency or at the aggregated carrier frequency respectively.

A filter provides frequency selectivity and improves the detector sensitivity for the wanted frequency by rejecting the unwanted frequency component. Rejection of the unwanted relative to the wanted signal can be achieved as part of the switched sensing element as well as part of the detector paths prior to non-linear operations.

FIG. 10E shows a simulation result of a phase detector with and without band-pass filter (BPF). The wanted signal is swept in power from −40 to +30 dBm, while the signal at the aggregated carrier is kept constant at +10 dBm. At high power for the wanted signal the detector reads +35°, which corresponds to the phase of the impedance at the wanted frequency. Without a band-pass filter the reading of the detector changes rapidly to −23° when the RF power at the wanted frequency is reduced, with a relatively narrow transition region between +5 and −5 dBm. With band-pass filter the aggregated carrier is suppressed, and the detector does not respond to the aggregated carrier. Since the detector sensitivity threshold level is approximately 0 dBm, the detector reading reduces to about 0° for reducing power of the wanted signal.

With band-pass filter the detector robustness to interferers improves especially around the sensitivity threshold level of the detector.

Figure 11:
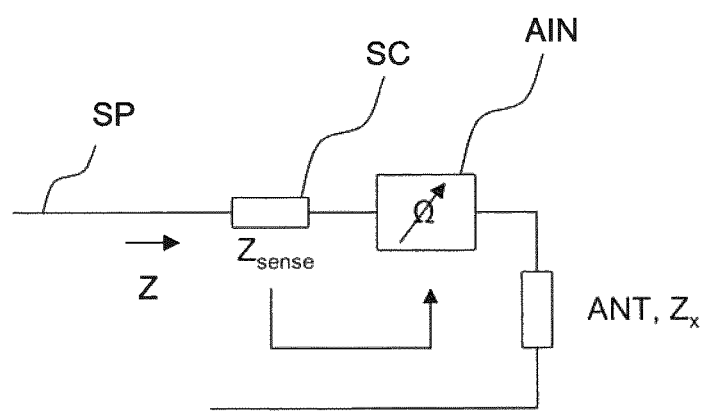

FIG. 11 schematically illustrates the reason for the need of an improved impedance detector. In the signal path SP, RF signals may propagate in the forward or in the backward direction for receiving or transmitting signals, respectively. A load impedance $Z_x$ may be realized as an antenna. In modern communication devices, patch antennas may be used as an antenna and such devices may comprise more than one antenna. Several antennas may interact with each other and detune an antenna. Further, a user's interaction, e.g. a hand, may also contribute to a detuning of the antenna. Thus, the load impedance $Z_x$ is variable and in principle unknown. Via an adjustable impedance network AIN, tuning can be performed and a tuned impedance can be obtained. However, the actual impedance has to be known. Therefore, the sensing circuit SC is utilized. It is possible that the value of the adjustable impedance network AIN is set based on the measured actual impedance via the sensing circuit SC in a closed control loop.

Figure 12:
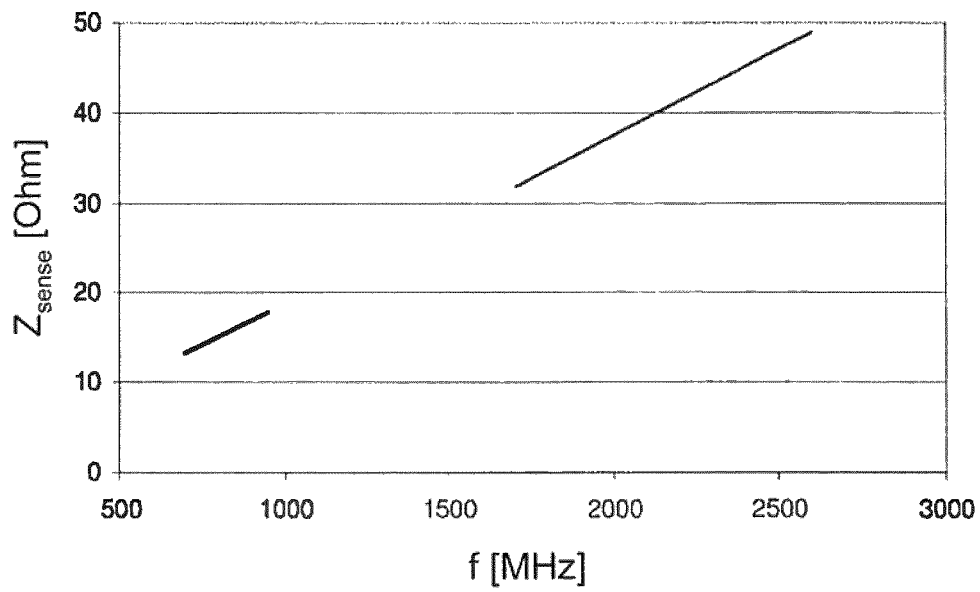

FIG. 12 shows the frequency depending value of the impedance of a sensing circuit in two different frequency bands. The impedance increases with increasing frequency.

Figure 13:
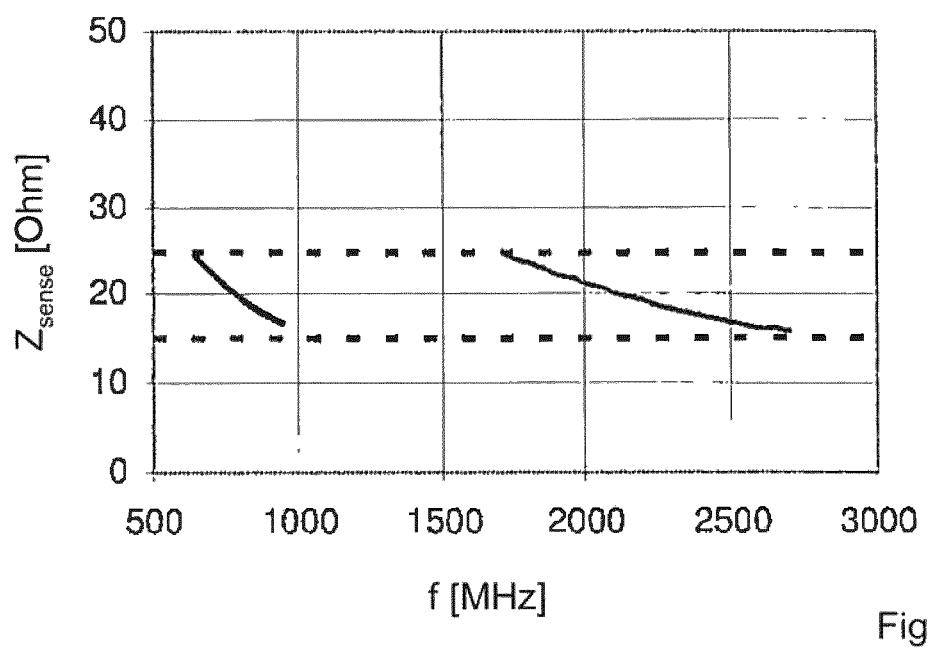

FIG. 13 shows the frequency dependent value of the impedance of a sensing circuit in the above mentioned frequency bands. For the lower frequency band, which may have a range from 700 MHz to 900 MHz, a first capacitance element is coupled to the signal path while in the higher frequency band, which may range from 1700 MHz to 2700 MHz, a second capacitance element having a higher impedance than the first capacitance element is utilized. As a result, the impedance of the sensing circuit does not fall below approximately 15Ω and does not exceed approximately 25Ω and, thus, provides a reliable impedance which has a lower frequency dependence than conventional sensing circuits. As a result, the corruption of the RF signal caused by the sensing circuit itself is reduced and a corresponding algorithm for reducing a mismatch is stabilized.

Figure 14:
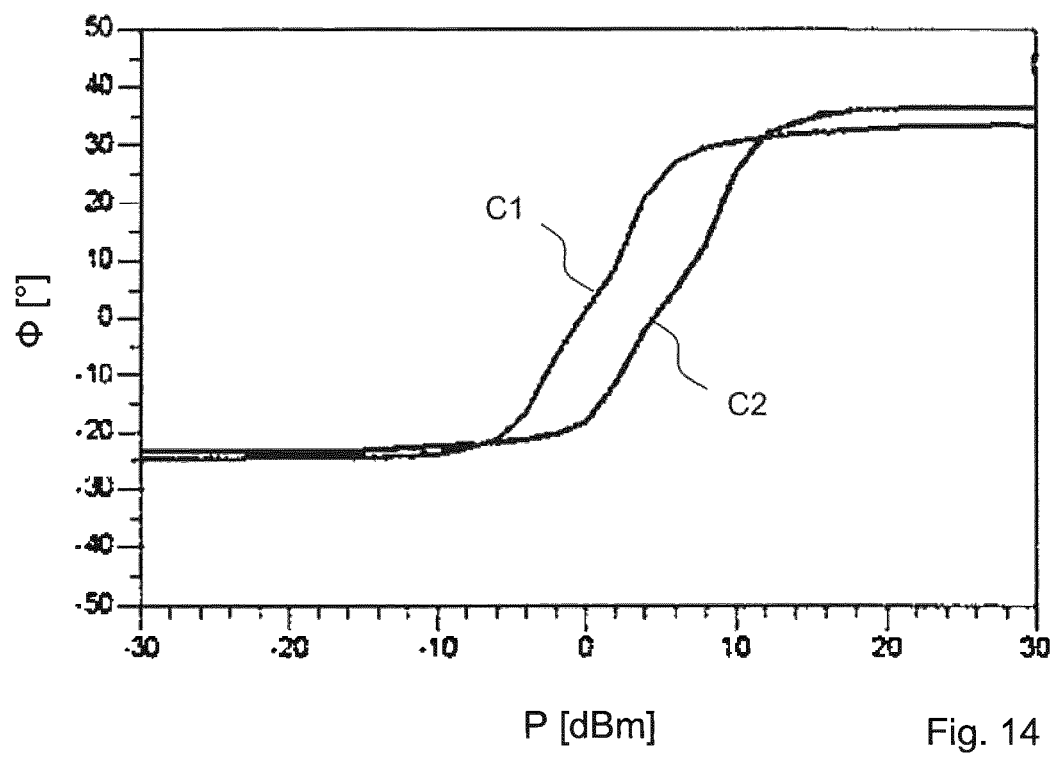
FIG. 14 illustrates the effect of an interfering signal when the sensing circuit comprises a fixed inductor.

FIG. 14 shows the dependence of a phase difference φ which depends on transmission power P. The first curve C1 represents the phase difference at 1950 MHz using a sensing circuit having an impedance of 3 nH. The second curve C2 represents the same sensing circuit (3 nH) at a frequency of 850 MHz. At low power values, the phase φ is mainly determined by an interferer and set to approximately −25°. When the power rises, the influence of the interferer decreases. A wanted phase φ of approximately 30-35° is obtained for powers higher than 8 dbm in the 1950 MHz case and for powers higher than 11 dbm in the 850 MHz case.

Figure 15:
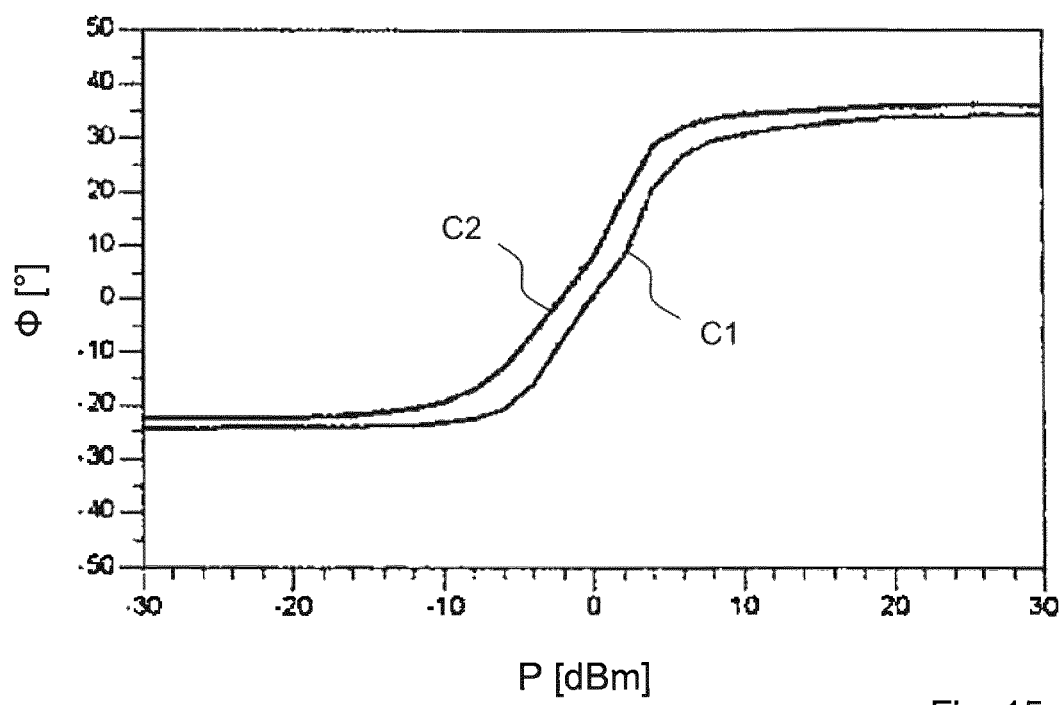
FIG. 15 illustrates the effect of an interference signal when the sensing circuit comprises a capacitance element and an inductance element.

FIG. 15 shows the power dependence of the phase φ corresponding to FIG. 14, however, with a sensing circuit comprising a capacitance element of 12.5 pF in a first parallel segment for the low-frequency band and an inductance element of 2 nH in a second parallel segment for the high-frequency band. In the high-frequency band, the wanted phase is obtained at approximately 8 dbm (C1). However, in the low-frequency band (C2), the wanted phase is already obtained at 6 dbm. This clearly shows that the dynamic range of the impedance detector and, thus, of the mobile communication device is improved via a sensing circuit with an adjustable impedance.

Neither the impedance detector nor the mobile communication device comprising the impedance detector is limited to the embodiments described in the specification or shown in the figures. Impedance detectors and communication devices comprising further fixed or adjustable impedance elements, further signal paths and further tuning circuit elements or combinations thereof are also comprised by the present invention.

LIST OF REFERENCE SIGNS

AD: analog/digital converter
AIN: adjustable impedance network
AMPC: amplification circuit
ATCC: attenuation circuit
C1, C2: signal power dependent phase φ
CE: capacitance element
CTRL: control circuit
DET: impedance detector
EC: evaluation circuit
EF: evaluation filter
FSF1, FSF2: frequency separating filter
IE: inductance element
INTF: interface
RF: RF signal propagating in the signal path
SC: sensing circuit
SP: signal path
SPI: signal path input
SPO: signal path output
SW: switch
SWC: switching circuit
Z: impedance of the signal path: $Z=Z_{sense}+Z_x$
Z1, Z2: first, second impedance
$Z_{sense}$: adjustable impedance of the sensing circuit
$Z_x$: impedance/load impedance
Ω: impedance of the adjustable impedance network

The invention claimed is:

1. An impedance detector, comprising
a signal path with an input and an output;
a sensing circuit coupled to the signal path, the sensing circuit having an adjustable impedance $Z_{sense}$
an evaluation circuit coupled to an input and an output of the sensing circuit, the evaluation circuit configured to evaluate the interaction between an RF signal propagating in the signal path and the sensing circuit;
an evaluation filter circuit comprising a plurality of different filters;
a switching circuit coupled to the evaluation filter circuit and configured to selectably couple one of the different filters between the sensing circuit and the evaluation circuit to enhance frequency selectivity of signals provided to the evaluation circuit from the sensing circuit;
an adjustable impedance network having an input coupled to the output of the sensing circuit; and
a controller having an input coupled to an output of the evaluation circuit and configured to adjust an impedance of the adjustable impedance network based on the output of the evaluation circuit.

2. The impedance detector of claim 1, wherein
the impedance $Z_{sense}$ is adjusted according to the frequency of the RF signal propagating in the signal path; and
the impedance detector is a multi band detector.

3. The impedance detector of claim 1 wherein the sensing circuit comprises any of an adjustable impedance element and two parallel segments with at least one fixed impedance element in each segment.

4. The impedance detector of claim 3 wherein at least one impedance element of the sensing circuit is electrically connected between the input and the output of the signal path.

5. The impedance detector of claim 1 wherein the sensing circuit comprises two parallel segments with at least one fixed impedance element in each segment, selected from the group consisting of a capacitance element and an inductance element.

6. The impedance detector of claim 1, wherein the sensing circuit comprises a switch between a connection of an impedance element and the signal path.

7. The impedance detector of claim 6, wherein the switch is selected from the group consisting of a semiconductor switch, a gallium arsenide (GaAs) pseudomorphic high-electron-mobility transistor (pHemt) switch, a silicon on insulator (SOI) switch, a silicon on sapphire (SOS) switch, and a micro-electromechanical (MEMS) switch.

8. The impedance detector of claim 1, wherein the sensing circuit comprises a varactor.

9. The impedance detector of claim 1, wherein the sensing circuit comprises an array of two or more capacitance or inductance elements.

10. The impedance detector of claim 1, wherein the sensing circuit comprises a frequency selective filter connected to a parallel connection of impedance elements.

11. The impedance detector of claim 1, further comprising an evaluation filter coupled between the sensing circuit and the evaluation circuit.

12. The impedance detector of claim 1, further comprising a switching circuit between the sensing circuit and the evaluation circuit.

13. The impedance detector of claim 1, further comprising an attenuation circuit between the sensing circuit and the evaluation circuit.

14. The impedance detector of claim 1, further comprising an amplification circuit between the sensing circuit and the evaluation circuit.

15. The impedance detector of claim 1, wherein
the impedance detector and the adjustable impedance network are part of an impedance matching circuit.

16. The impedance detector of claim 15, wherein the sensing circuit (SC) comprises two parallel segments with at least one impedance element in each segment, selected from the group consisting of a capacitance element and an inductance element.

17. The impedance detector of claim 1, further comprising a substrate, wherein the detector's circuit elements are arranged on or in the substrate.

18. The impedance detector of claim 17, wherein the substrate comprises silicon.

19. The impedance detector of claim 1, wherein
at least one of the sensing circuit, the evaluation circuit, the adjustable impedance network and the controller is realized using a technology selected from the group consisting of a silicon technology, a gallium arsenide (GaAs) technology, a complementary metal oxide semiconductor (CMOS) technology, a silicon on sapphire (SOS) technology, and a silicon on insulator (SOI) technology.

20. A mobile communication device comprising an impedance detector configured to determine the impedance of a signal path, the impedance detector comprising:
a signal path with an input and an output;
a sensing circuit coupled to the signal path, the sensing circuit having an adjustable impedance $Z_{sense}$;
an evaluation circuit coupled to an input and an output of the sensing circuit having the adjustable impedance $Z_{sense}$, the evaluation circuit configured to evaluate the interaction between an RF signal propagating in the signal path and the sensing circuit and to provide a signal representing an evaluation result;
an evaluation filter circuit comprising a plurality of different filters;
a switching circuit coupled to the evaluation filter circuit and configured to selectably couple one of the different filters between the sensing circuit and the evaluation circuit to enhance frequency selectivity of signals provided to the evaluation circuit from the sensing circuit;
an adjustable impedance network having an input coupled to the output of the sensing circuit having the adjustable impedance $Z_{sense}$; and
a controller having an input coupled to an output of the evaluation circuit and configured to adjust an impedance of the adjustable impedance network in response to the signal representing the evaluation result.

* * * * *

UNITED STATES PATENT AND TRADEMARK OFFICE
CERTIFICATE OF CORRECTION

PATENT NO. : 9,851,384 B2
APPLICATION NO. : 14/646473
DATED : December 26, 2017
INVENTOR(S) : Adrianus van Bezooijen Page 1 of 1

It is certified that error appears in the above-identified patent and that said Letters Patent is hereby corrected as shown below:

On the Title Page

Item (73) Assignee:, remove "Qualcomm Incorporated, San Diego, CA (US)" and replace with --QUALCOMM Technologies, Inc. San Diego, CA (US)--

Signed and Sealed this
Eighteenth Day of September, 2018

Andrei Iancu
*Director of the United States Patent and Trademark Office*